United States Patent [19]
Kim

[11] Patent Number: 5,717,638
[45] Date of Patent: Feb. 10, 1998

[54] MULTI-PORT MEMORY CELLS AND MEMORY WITH PARALLEL DATA INITIALIZATION

[75] Inventor: Jung-Kwon Kim, Suwon, Rep. of Korea

[73] Assignee: Samsung Electronics Co., Ltd., Rep. of Korea

[21] Appl. No.: 751,910

[22] Filed: Nov. 18, 1996

[51] Int. Cl.$^6$ ............................................. G11C 13/00
[52] U.S. Cl. .................. 365/189.04; 365/189.05; 365/230.05
[58] Field of Search .................. 365/189.04, 189.05, 365/189.09, 203, 230.05, 230.08

[56] References Cited

U.S. PATENT DOCUMENTS 5,493,536  2/1996  Aoki .............................. 365/203

*Primary Examiner*—Terrell W. Fears
*Attorney, Agent, or Firm*—Skjerven, Morrill, MacPherson Franklin & Friel

[57] ABSTRACT

A static RAM memory cell with a plurality of input/output ports is disclosed including: a latch circuit which maintains complementary voltages at first and second nodes; a first output circuit which generates an output signal having an state inverted from the voltage of the first node; a second output circuit which generates an output signal having an state inverted from the voltage of the second node; a first transfer circuit for transferring the output signals from the first and second output circuits to a first sense amplifier in response to a first read control signal; a second transfer circuit for transferring the output signals from the first and second output circuits to a second sense amplifier in response to a second read control signal; a third transfer circuit for transferring an external voltage to the first node in response to a write control signal; and a reset circuit for resetting the latch circuit to initialize data in response to a reset signal.

14 Claims, 3 Drawing Sheets

MULTI-PORT MEMORY CELLS AND MEMORY WITH PARALLEL DATA INITIALIZATION

BACKGROUND OF THE INVENTION

1. Field of the Invention

This invention relates to a semiconductor memory cell having a plurality of input/output ports, to a semiconductor memory device using such semiconductor memory cells, and more particularly to a triple-port static RAM (random access memory) which can simultaneously initialize a plurality of memory cells.

2. Description of Related Art

FIG. 1 illustrates a typical dual port static RAM cell which includes a latch circuit 10 and first and second read circuits 15 and 20. Latch circuit 10 is coupled between first and second nodes N1 and N2 and sets the second node N2 to a voltage level that is complementary to a voltage level of the first node N1. In particular, the voltage at node N2 is high (near a supply voltage VDD) when the voltage at node N1 is low (near a ground voltage VSS), and the voltage at node N2 is low when the voltage at node N1 is high. To maintain the complementary voltages at nodes N1 and N2, latch 10 includes transistors P4 and N4 which form a first CMOS inverter that has node N2 as an input node and node N1 as an output node. Similarly, transistors P3 and N3 form a second inverter that has node N1 as an input node and node N2 as an output node.

The first read circuit 15 is associated with a first pair of bit lines BB1 and B1 and connects nodes N1 and N2 to respective bit lines BB1 and B1 in response to a first read control signal WL1. A select transistor N5 in read circuit 15 provides a current path between node N1 and bit line BB1 in response to the first read control signal WL1. Another select transistor N6 in read circuit 15 provides a current path between node N2 and bit line B1 in response to the first read control signal WL1. If the first read control signal WL1 is asserted high, the voltage level of node N1 is read to bit line BB1, and the voltage level of node N2 is read to bit line B1.

The second read circuit 20 is associated with a second pair of bit lines BB2 and B2 and connects nodes N1 and N2 to respective bit lines BB2 and B2 in response to a second read control signal WL2. A select transistor N7 in read circuit 20 provides a current path between node N1 and bit line BB2 in response to the second read control signal WL2. Another select transistor N8 in read circuit 20 provides a current path between node N2 and bit line B2 in response to the second read control signal WL2. If the second read control signal WL2 is asserted high, the voltage level of node N1 is read to bit line BB2, and the voltage level of node N2 is read to bit line B2.

A dual-port static RAM containing memory cells such as shown in FIG. 1 has first and second bit line ports which can operate independently according to control signals from peripheral circuits. The first bit line port connects to bit lines BB1 and B1, and the second bit line port connects to bit lines BB2 and B2. Conventional row decoders (not shown) can decode address signals and generate control signals WL1 and WL2 for accessing selected memory cells. Either bit line port may be used as a read port or a write port. When initializing data in the static RAM, an address is sequentially changed, and initial data is written to each address using a conventional write operation. For example, if a memory has ten addresses, ten write operations sequential are required to initialize the memory. Consequently, in the conventional dual-port static RAM, initializing all of the memory cells takes a long time because of the large number of write operations required to write initial data in the memory cells.

SUMMARY OF THE INVENTION

The invention provides a semiconductor memory cell with a plurality of input/output ports and a semiconductor memory device which can simultaneously initialize a plurality of memory cells during one clock period.

According to one aspect of the invention, a triple-port semiconductor memory cell includes: a latch circuit coupled to first and second nodes, wherein the latch circuit sets the second node to a voltage level complementary to the voltage level at the first node; first and second output circuits which generate output signals indicating the voltages at the first and second nodes; a first transfer circuit for transferring the output signals of the first and second output circuits to a first sense amplifier in response to a first read control signal; a second transfer circuit for transferring the output signals of the first and second output circuits to a second sense amplifier in response to a second read control signal; a third transfer circuit for transferring an external voltage to the first node in response to a write control signal; and a reset circuit for resetting the latch circuit in response to a reset signal.

According to another aspect of the invention, a semiconductor memory device includes a plurality of memory cells each having: a latch circuit coupled to first and second nodes, wherein the latch circuit sets the second node to a voltage level complementary to the voltage level at the first node; first and second output circuits which generate output signals indicating the voltages at the first and second nodes; a first transfer circuit for transferring the output signals of the first and second output circuits to a first sense amplifier in response to a first read control signal; a second transfer circuit for transferring the output signals of the first and second output circuits to a second sense amplifier in response to a second read control signal; a third transfer circuit for transferring an external voltage to the first node in response to a write control signal; and a reset circuit for resetting the latch circuit in response to a reset signal. The reset circuits in the memory device are coupled together to simultaneously reset the plurality of memory cells within one cycle.

BRIEF DESCRIPTION OF THE DRAWINGS

The objects, features, and advantages of the present invention will be more apparent after a reading of the following detailed description taken in conjunction with the drawings, in which.

DETAILED DESCRIPTION OF PREFERRED EMBODIMENT

Figure 1:
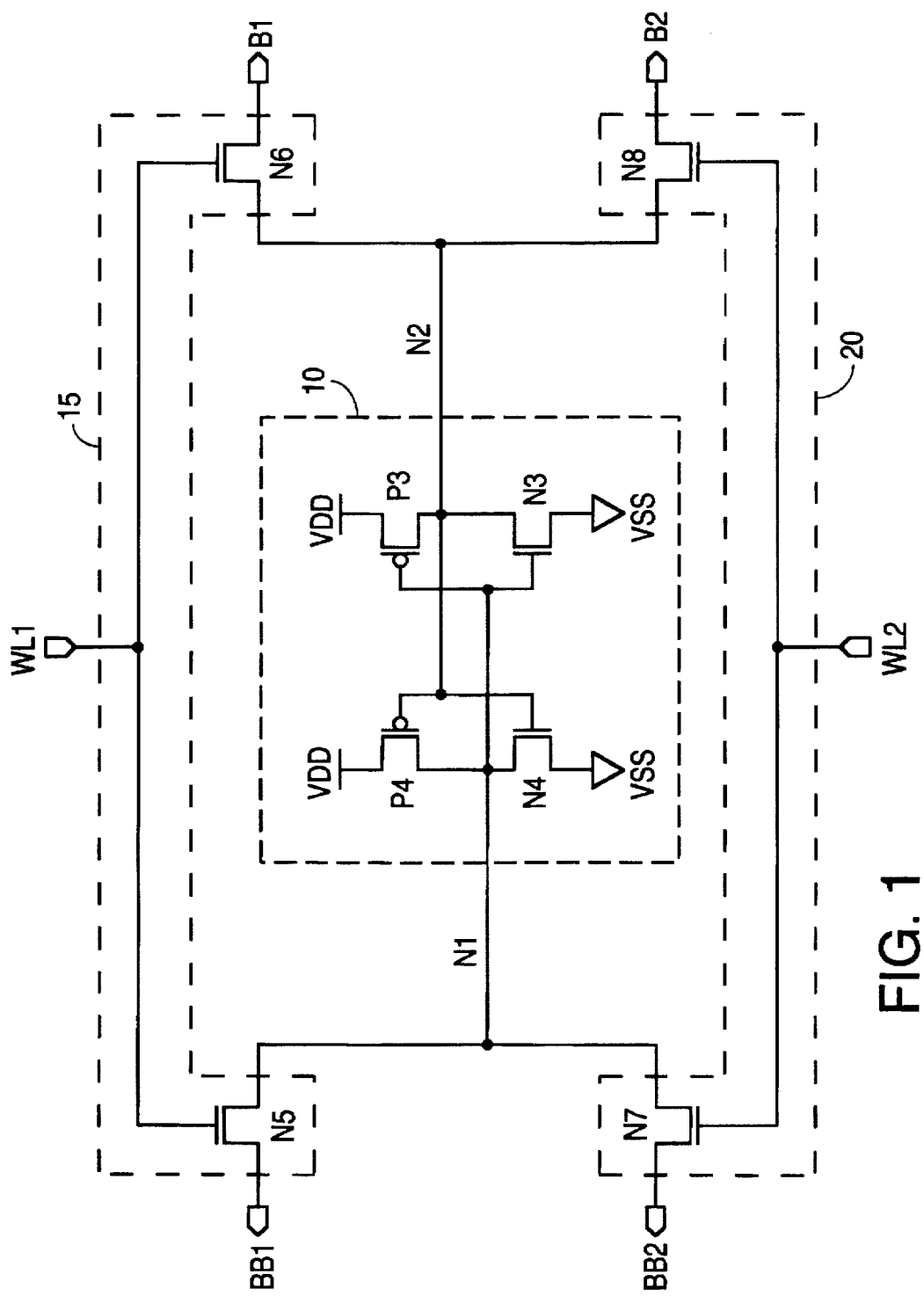
FIG. 1 is a circuit diagram illustrating a conventional dual port static RAM cell.
Figure 2:
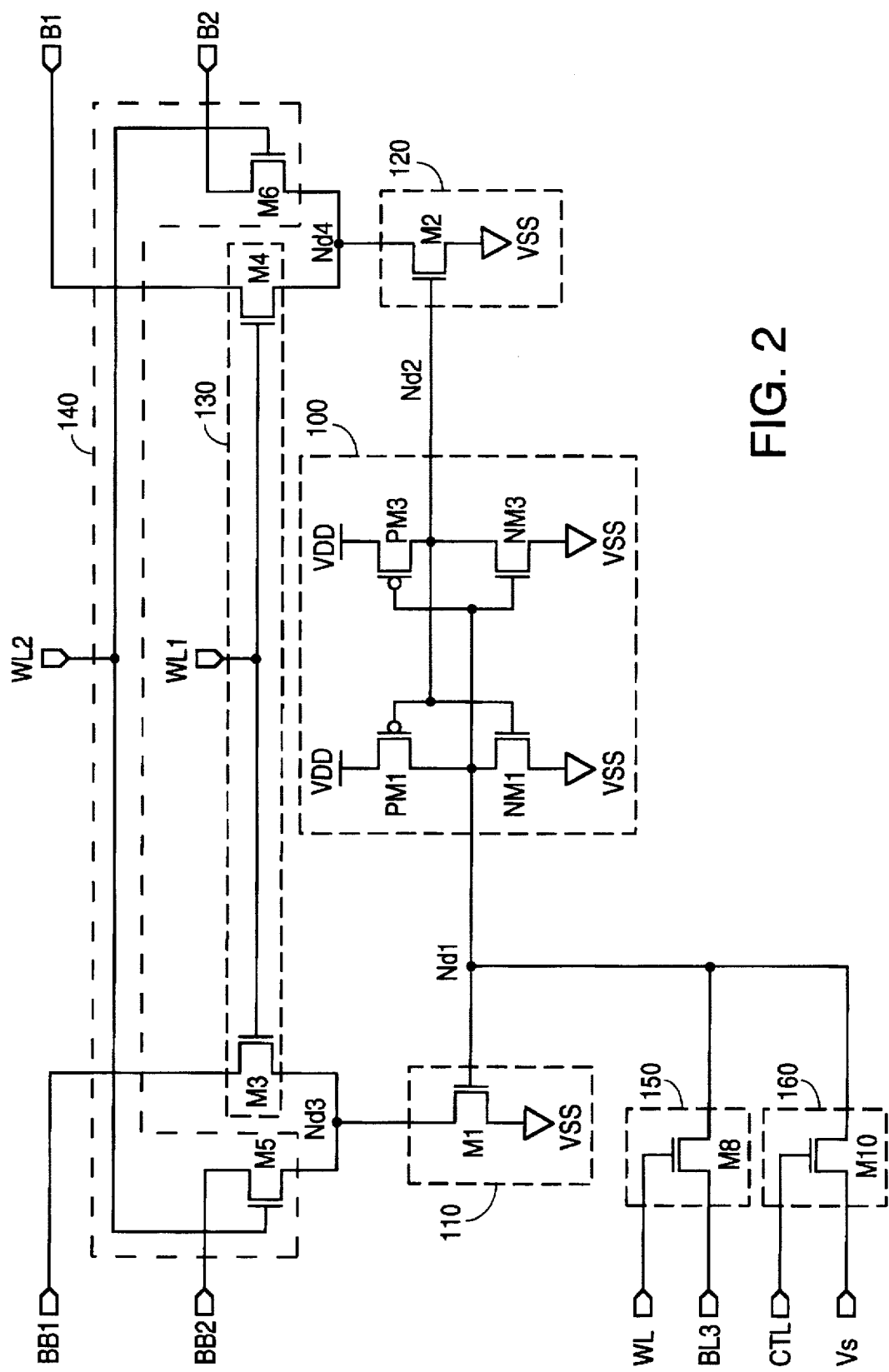
FIG. 2 is a circuit diagram illustrating a triple-port memory cell according to an embodiment of the invention.

FIG. 2 shows a triple-port static RAM cell including: a latch circuit 100; output circuits 110 and 120; transfer circuits 130, 140, and 150; and a reset/initialization circuit 160. Latch circuit 100 is coupled to first and second nodes Nd1 and Nd2 and sets a voltage at node Nd2 to a level complementary to a voltage at node Nd1. First and second output circuits 110 and 120 are connected to nodes Nd1 and Nd2, respectively. A first transfer circuit 130, in response to a first read control signal WL1, routes output signals from the first and second output circuits 110 and 120 to a first pair of bit lines BB1 and B1, respectively. A second transfer circuit 140 connects the output signals from output circuits 110 and 120 to a second pair of bit lines BB2 and B2, respectively, in response to a second read control signal WL2. A third transfer circuit 150 connects a bit line BL3 to node Nd1 in response to a write control signal WL. Reset circuit 160, in response to a reset signal CTL, sets latch circuit 100 to a state indicated by a signal Vs.

Latch circuit 100 includes a first CMOS inverter consisting of transistors PM1 and NM1 connected in series between supply voltage VDD and a reference (or ground) voltage VSS and a second CMOS inverter consisting of transistors PM3 and NM3 also connected in series between supply voltage VDD and reference voltage VSS. Node Nd1 is the input node of the second inverter and the output node of the first inverter. Node Nd2 is the input node of the first inverter and the output node of the second inverter. If the high level of a supply voltage VDD is applied to node Nd1, the second inverter drives the second node Nd2 toward the low level of voltage VSS, and the low voltage at second node Nd2 causes the first inverter to drive the first node Nd1 toward the high voltage. Similarly, when voltage VSS is applied to node Nd1, the second inverter drives node Nd2 toward the high level of supply voltage VDD, and the first inverter drives node Nd1 toward the low level of voltage VSS. Thus, nodes Nd1 and Nd2 are latched at complementary voltages.

The first output circuit 110 includes an NMOS transistor M1 which is coupled between a third node Nd3 and ground voltage VSS and has a gate coupled to the first node Nd1. If node Nd1 is at a high voltage, transistor M1 is turned on to pull node Nd3 down to ground voltage VSS. If node Nd1 is at a low voltage, NMOS transistor M1 is turned off and node Nd3 remains at a precharge level.

The second output circuit 120 includes an NMOS transistor M2 which is coupled between a fourth node Nd4 and ground voltage VSS and has a gate coupled to the second node Nd2. If the second node Nd2 is at a low voltage, NMOS transistor M2 is turned off to maintain the state of node Nd4. If node Nd2 is at a high voltage, NMOS transistor M2 is turned on and the state of node Nd3 is pulled down to voltage VSS.

The first transfer circuit 130 includes NMOS transistors M3 and M4. NMOS transistor M3 is coupled between node Nd3 and the first inverting bit line BB1 and responds to the first read control signal WL1. NMOS transistor M4 is coupled between node Nd4 and the first noninverting bit line B1 and responds to the first read control signal WL1. If the first read signal WL1 is asserted high, transistor M3 connects node Nd3 to bit line BB1, and transistor M4 connects node Nd4 to the first noninverting bit line B1. The first pair of inverting and noninverting bit lines BB1 and B1 is coupled to a first bit line sense amplifier (not shown) which senses the state of the memory cell connected to bit lines BB1 and B1.

The second transfer circuit 140 has NMOS transistors M5 and M6. NMOS transistor M5 is coupled between node Nd3 and the second inverting bit line BB2 and responds to the second read control signal WL2. NMOS transistor M6 is coupled between node Nd4 and the second noninverting bit line B2 and responds to the second read control signal WL2. If the second read signal WL2 is asserted high, transistor M5 connects node Nd3 to the second inverting bit line BB2, and transistor M6 connects node Nd4 to the second noninverting bit line B2. The second pair of inverting and noninverting bit lines BB2 and B2 is connected to a second bit line sense amplifier (not shown).

The third transfer circuit 150 includes an NMOS transistor M8 which is coupled between node Nd1 and bit line BL3 and connects bit line BL3 to node Nd1 in response to the write control signal WL. A voltage applied to bit line BL3 can thus change the voltage at node Nd1 to write a data value in the memory cell when write control signal WL is asserted high.

Reset circuit 160 includes an NMOS transistor between node Nd1 and an initialization voltage Vs and transfers the initialization voltage Vs to the first node Nd1 in response to reset signal CTL. If initialization voltage Vs is at the level of ground voltage VSS, the voltage level at node Nd2 of latch circuit 100 is set to a high state when reset signal CTL is asserted and voltage VSS applied to node Nd1. The voltage at node Nd2 of latch circuit 100 is reset to a low state when initialization voltage Vs is at the level of supply voltage VDD and is applied to the first node Nd1. Alternatively, reset circuit 160 may be connected to the second node Nd2 instead of the first node Nd1.

In an array of memory cells such as shown in FIG. 2, reset circuit 160 is provided in each memory cells. Reset signal CTL is simultaneously applied to all of the reset circuits to simultaneously reset all of the memory cells and store initial data indicated by voltage Vs.

In the inventive triple-port static RAM cell, the reset circuit is additionally connected to a write port and thus the initialization data can be written in all the memory cells within one cycle irrespective of a write path. Therefore, an initialization operation of the memory can be implemented at high speed within one cycle.

Figure 3:
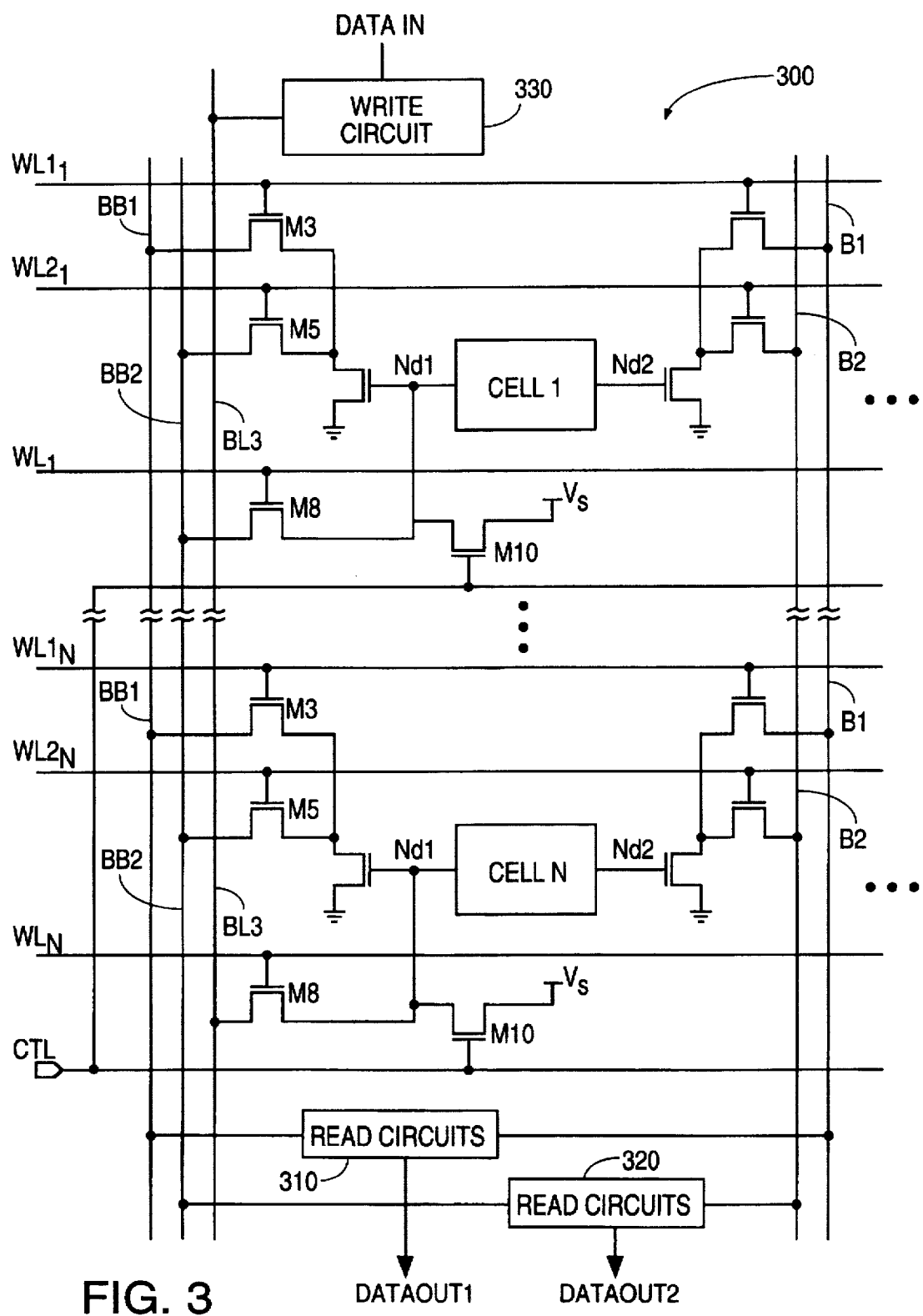
FIG. 3 is a block diagram illustrating a memory according to an embodiment of the invention.

FIG. 3 shows a block diagram of an array 300 of memory cells arranged in rows and columns with one write circuit 330 and two read circuits 310 and 320 per column. Write circuit 330 is a conventional SRAM circuit which applies the necessary bit-line voltage for writing a data bit DATAIN to a selected memory cell in an associated column. Read circuits 310 and 320 are also conventional and typically include precharge circuity and sense amplifiers for sensing voltage or current on attached bit lines BB1 and B1 or BB2 and B2. A single signal CTL applied to all the memory cells resets array 300. However, a selected memory cell can be written to by asserting the one of signals $WL_1$ to $WL_N$ associated with the row containing the selected memory cell and applying a data bit DATAIN to the write circuit 330 associated with the column containing the selected memory cell. Memory cells are read by asserting one of signals $WL1_1$ to $WL1_N$ and/or one of signals $WL2_1$ to $WL2_N$ which causes read circuit 310 and/or 320 to generate an output data signal DATAOUT1 and/or DATAOUT2.

The drawings and specification have disclosed typical embodiments of the invention and, although specific terms are employed, they are used in a generic and descriptive sense only and not for purposes of limitation, the scope of the invention being set forth in the following claims.

What is claimed is:

1. A memory cell comprising:
   a latch circuit coupled to first and second nodes, wherein said latch circuit sets said first node at a voltage which is complementary to a voltage level at said second node;
   first output means for generating a first output signal indicating said voltage at said first node;
   second output means for generating a second output signal indicating said voltage at said second node;

first transfer means for transferring said first and second output signals to a first sense amplifier in response to a first read control signal;

second transfer means for transferring said first and second output signals to a second sense amplifier in response to a second read control signal;

third transfer means for applying an external voltage to said first node in response to a write control signal; and reset means for resetting said latch circuit to initialize data in response to a reset signal.

2. The memory cell of claim 1, wherein:

said first output means comprises a source-grounded NMOS transistor having a gate connected to said first node and a drain connected to said first and second transfer means; and said second output means comprises a source-grounded NMOS transistor having a gate connected to said second node and having a drain connected to said first and second transfer means.

3. The memory cell of claim 1, wherein said reset means comprises an NMOS transistor having a gate connected to receive said reset signal, having a source connected to receive a voltage representing said initialization data, and having a drain connected to said first node.

4. The memory cell of claim 3, wherein said voltage representing said initialization data is a ground voltage.

5. A semiconductor memory device comprising:

a plurality of memory cells, each of said memory cells comprising:

a latch circuit coupled to first and second nodes, wherein said latch circuit sets said first node at a voltage which is complementary to a voltage level at said second node;

first output means for generating a first output signal indicating said voltage at said first node;

second output means for generating a second output signal indicating said voltage at said second node;

first transfer means for transferring said first and second output signals to a first sense amplifier in response to a first read control signal;

second transfer means for transferring said first and second output signals to a second sense amplifier in response to a second read control signal;

third transfer means for applying an external voltage to said first node in response to a write control signal; and reset means for resetting said latch circuit to initialize data in response to a reset signal, wherein said reset means of said plurality of memory cells are coupled to each other to enable said plurality of memory cells to be simultaneously reset.

6. A memory cell comprising:

a first inverter and a second inverter, wherein an input terminal of said first inverter and an output terminal of said second inverter are coupled to a first node and an output terminal of said first inverter and an input terminal of said second inverter are coupled to a second node;

a first transistor having a gate coupled to said first node and a source coupled to a reference voltage;

a second transistor having a gate coupled to said second node and a source coupled to said reference voltage;

a third transistor coupled between a drain of said first transistor and a first bit line;

a fourth transistor coupled between a drain of said second transistor and a second bit line; and a fifth transistor coupled between said first node and a source of a voltage representing data to be written.

7. The memory circuit of claim 6, further comprising:

a sixth transistor coupled between said drain of said first transistor and a third bit line; and a seventh transistor coupled between said drain of said second transistor and a fourth bit line.

8. The memory circuit of claim 7, further comprising an eighth transistor coupled between said first node and a source of a voltage representing data to be written.

9. The memory circuit of claim 6, further comprising an eighth transistor coupled between said first node and a source of a voltage representing data to be written.

10. A memory circuit comprising a plurality of memory cells, wherein each of said memory cells comprises:

a first inverter and a second inverter, wherein an input terminal of said first inverter and an output terminal of said second inverter are coupled to a first node and an output terminal of said first inverter and an input terminal of said second inverter are coupled to a second node;

a first transistor having a gate coupled to said first node and a source coupled to a reference voltage;

a second transistor having a gate coupled to said second node and a source coupled to said reference voltage;

a third transistor coupled between a drain of said first transistor and a first bit line;

a fourth transistor coupled between a drain of said second transistor and a second bit line; and a fifth transistor coupled between said first node and a source of a voltage representing data to be written.

11. The memory circuit of claim 10, wherein each of said memory cells further comprises:

a sixth transistor coupled between said drain of said first transistor and a third bit line; and a seventh transistor coupled between said drain of said second transistor and a fourth bit line.

12. The memory circuit of claim 11, wherein each of said memory cells further comprises an eighth transistor coupled between said first node and a source of a voltage representing data to be written.

13. The memory circuit of claim 10, wherein each of said memory cells further comprises an eighth transistor coupled between said first node and a source of a voltage representing data to be written.

14. The memory circuit of claim 13, wherein said eighth transistors in said memory cells has gates coupled to a source of a reset control signal for said memory circuit.

* * * * *